United States Patent
Dierichs

(10) Patent No.: US 7,326,522 B2
(45) Date of Patent: Feb. 5, 2008

(54) DEVICE MANUFACTURING METHOD AND A SUBSTRATE

(75) Inventor: Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 637 days.

(21) Appl. No.: 10/775,326

(22) Filed: Feb. 11, 2004

(65) Prior Publication Data

US 2005/0175940 A1    Aug. 11, 2005

(51) Int. Cl.
*G03F 7/20* (2006.01)
*G03F 7/11* (2006.01)

(52) U.S. Cl. ..................... 430/311; 430/961
(58) Field of Classification Search ............... 430/311, 430/961
See application file for complete search history.

(56) References Cited

U.S. PATENT DOCUMENTS

| | | | |
|---|---|---|---|
| 3,573,975 A | 4/1971 | Dhaka et al. ............. 117/212 |
| 3,648,587 A | 3/1972 | Stevens ........................ 95/44 |
| 4,346,164 A | 8/1982 | Tabarelli et al. ........... 430/311 |
| 4,390,273 A | 6/1983 | Loebach et al. ............ 355/125 |
| 4,396,705 A | 8/1983 | Akeyama et al. ........... 430/326 |
| 4,480,910 A | 11/1984 | Takanashi et al. ............ 355/30 |
| 4,509,852 A | 4/1985 | Tabarelli et al. ............. 355/30 |
| 5,040,020 A | 8/1991 | Rauschenbach et al. ...... 355/53 |
| 5,121,256 A | 6/1992 | Corle et al. ................. 359/664 |
| 5,339,128 A | 8/1994 | Tateyama et al. | |
| 5,610,683 A | 3/1997 | Takahashi ..................... 355/53 |
| 5,715,039 A | 2/1998 | Fukuda et al. ................ 355/53 |
| 5,825,043 A | 10/1998 | Suwa ........................ 250/548 |
| 5,900,354 A | 5/1999 | Batchelder .................. 430/395 |
| 5,962,079 A | 10/1999 | Koberstein et al. | |
| 6,191,429 B1 | 2/2001 | Suwa ........................ 250/548 |
| 6,236,634 B1 | 5/2001 | Lee et al. ................... 369/112 |
| 6,560,032 B2 | 5/2003 | Hatano ...................... 359/656 |
| 6,600,547 B2 | 7/2003 | Watson et al. | |
| 6,603,130 B1 | 8/2003 | Bisschops et al. ........ 250/492.1 |
| 6,633,365 B2 | 10/2003 | Suenaga ...................... 355/53 |
| 6,788,477 B2 | 9/2004 | Lin | |
| 6,992,750 B2 | 1/2006 | Kawashima et al. | |
| 7,175,968 B2 | 2/2007 | Dierichs et al. | |
| 2002/0020821 A1 | 2/2002 | Van Santen et al. ........ 250/492 |
| 2002/0163629 A1 | 11/2002 | Switkes et al. ............... 355/53 |
| 2003/0030916 A1 | 2/2003 | Suenaga | |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Mark F. Huff
*Assistant Examiner*—Brittany Raymond
(74) *Attorney, Agent, or Firm*—Pillsbury Winthrop Shaw Pittman LLP

(57) ABSTRACT

A method of reducing the effect of bubbles on the imaging quality of an immersion lithography apparatus, in which a top coating is applied to a substrate to keep bubbles away from a radiation sensitive layer of the substrate.

20 Claims, 3 Drawing Sheets

U.S. PATENT DOCUMENTS

| | | |
|---|---|---|
| 2003/0123040 A1 | 7/2003 | Almogy .................. 355/69 |
| 2003/0174408 A1 | 9/2003 | Rostalski et al. .......... 359/642 |
| 2004/0000627 A1 | 1/2004 | Schuster |
| 2004/0021844 A1 | 2/2004 | Suenaga |
| 2004/0075895 A1 | 4/2004 | Lin ..................... 359/380 |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. ......... 355/30 |
| 2004/0125351 A1 | 7/2004 | Krautschik .................. 355/53 |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0002004 A1 | 1/2005 | Kolesynchenko et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068639 A1 | 3/2005 | Pierra et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0123863 A1 | 6/2005 | Chang et al. |
| 2005/0130079 A1 | 6/2005 | Endo et al. |
| 2005/0141098 A1 | 6/2005 | Schuster |
| 2005/0147920 A1* | 7/2005 | Lin et al. ..................... 430/311 |
| 2005/0175940 A1 | 8/2005 | Dierichs |
| 2005/0190455 A1 | 9/2005 | Rostalski et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0225738 A1 | 10/2005 | Shirai |
| 2006/0141400 A1 | 6/2006 | Hirayama et al. |
| 2006/0274294 A1 | 12/2006 | Nagasaka et al. |
| 2007/0103655 A1 | 5/2007 | Dierichs et al. |

FOREIGN PATENT DOCUMENTS

| | | |
|---|---|---|
| DE | 221 563 A1 | 4/1985 |
| DE | 221 583 | 4/1985 |
| DE | 224 448 A1 | 7/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 0 834 773 A2 | 4/1998 |
| EP | 1039511 | 9/2000 |
| EP | 1 477 856 A1 | 11/2004 |
| EP | 1 491 956 A1 | 12/2004 |
| FR | 2474708 | 7/1981 |
| JP | A-57-153433 | 9/1982 |
| JP | A 57-153433 | 9/1982 |
| JP | 58-202448 | 11/1983 |
| JP | A-58-202448 | 11/1983 |
| JP | A 59-19912 | 2/1984 |
| JP | A-59-19912 | 2/1984 |
| JP | 62-065326 | 3/1987 |
| JP | A 62-65326 | 3/1987 |
| JP | 62-121417 | 6/1987 |
| JP | 63-157419 | 6/1988 |
| JP | A 63-157419 | 6/1988 |
| JP | 04-305915 | 10/1992 |
| JP | 04-305917 | 10/1992 |
| JP | A-4-305915 | 10/1992 |
| JP | A-4-305917 | 10/1992 |
| JP | A-5-62877 | 3/1993 |
| JP | A 05-62877 | 3/1993 |
| JP | A 5-304072 | 11/1993 |
| JP | 06-124873 | 5/1994 |
| JP | A 6-124873 | 5/1994 |
| JP | A 6-168866 | 6/1994 |
| JP | 07-132262 | 5/1995 |
| JP | 07-220990 | 8/1995 |
| JP | A 7-220990 | 8/1995 |
| JP | A 08-316125 | 11/1996 |
| JP | A-8-316125 | 11/1996 |
| JP | A 10-154659 | 6/1998 |
| JP | 10-228661 | 8/1998 |
| JP | 10-255319 | 9/1998 |
| JP | A 10-255319 | 9/1998 |
| JP | 10-303114 | 11/1998 |
| JP | A 10-303114 | 11/1998 |
| JP | 10-340846 | 12/1998 |
| JP | A 10-340846 | 12/1998 |
| JP | 11-176727 | 7/1999 |
| JP | A 11-176727 | 7/1999 |
| JP | 2000-058436 | 2/2000 |
| JP | A 2000-58436 | 2/2000 |
| JP | 2001-091849 | 4/2001 |
| JP | 2004-193252 | 7/2004 |
| WO | WO99/49504 | 9/1999 |
| WO | WO 99/49504 | 9/1999 |
| WO | WO 02/091078 A1 | 11/2002 |
| WO | WO 03/077036 | 9/2003 |
| WO | WO 03/077037 | 9/2003 |
| WO | WO 03/077037 A1 | 9/2003 |
| WO | WO 2004/019128 | 3/2004 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A1 | 9/2004 |
| WO | WO 2004/077154 A2 | 9/2004 |
| WO | WO 2004/081666 A1 | 9/2004 |
| WO | WO 2004/081668 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |

| | | |
|---|---|---|
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata, et al., "Optical Projection Lithography using Lenses with Numerical Apertures Greater than Unity", Microelectronic Engineering 9 (1989), pp. 31-38.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, J. Microlith., Microfab., Microsyt. 1(1):7-12 (2002).

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Swilkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, Litho Forum, Jan. 28, 2004, "Update on 193 nm immersion exposure tool", S. Owa et al., 51 pages (slides 1-51).

Nikon Corporation, Immersion Lithography Workshop, Dec. 11, 2002, 24 pages (slides 1-24).

Nikon Corporation, Immersion Workshop, Jan. 27, 2004, "Update on I93 nm immersion exposure tool", Owa et al., 38 pages (slides 1-38).

Nikon Corporation, "Nikon F2 Exposure Tool", Soichi OWA et al., Sep. 4, 2003, 3rd 157nm symposium, 25 pages.

Nikon Corporation, "Immersion lithography; its potential performance and issues", Soichi OWA et al., Proceedings of SPIE, Optical Microlithography XVI, vol. 5040, Jun. 2003, pp. 724-733.

Nikon Corporation, "Potential performance and feasibility of immersion lithography", Soichi OWA et al., NGL Workshop, Jul. 10, 2003, 33 pages.

Information Disclosure Statement filed Aug. 11, 2006 for U.S. Appl. No. 11/502,414.

Office Action dated Jan. 6, 2006 issued for U.S. Appl. No. 10/898,674.

Office Action dated May 1, 2006 issued for U.S. Appl. No. 10/898,674.

Office Action dated Aug. 17, 2006 issued U.S. Appl. No. 10/898,674.

* cited by examiner

DEVICE MANUFACTURING METHOD AND A SUBSTRATE

FIELD

The present invention relates to a device manufacturing method and a substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse at least a portion of a substrate in a lithographic projection apparatus in a liquid having a relatively high refractive index, e.g. water, so as to fill a space between an element of the projection system and the substrate. The point of this is to enable imaging of smaller features since the exposure radiation will have a shorter wavelength in the liquid. (The effect of the liquid may also be regarded as increasing the effective NA of the lithographic projection apparatus and also increasing the depth of focus.)

However, submersing a substrate or a substrate and substrate table in a bath of liquid (see for example U.S. Pat. No. 4,509,852, hereby incorporated in its entirety by reference) means that there may be a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between a final element of the projection system and the substrate using a liquid supply system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

In addition to the liquid supply system described above, it also possible is to provide a liquid supply system with a seal member which extends along at least a part of a boundary of the space between an element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system is disclosed in U.S. patent application Ser. No. 10/705,783, filed Nov. 12, 2003, hereby incorporated in its entirety by reference.

Other types of liquid supply systems are clearly possible including those with different arrangements of inlets and outlets and also those which are asymmetric.

A difficulty in immersion lithography has been found to be the existence of bubbles and/or particles in the immersion liquid. This is particular problem during scanning of the substrate with respect to the projection system. In this circumstance it is possible that bubbles and/or particles become attached to the substrate surface. These bubbles and/or particles can disrupt the patterned beam so that the quality of the substrate produced may be reduced.

Accordingly, it would be advantageous, for example, to reduce the effect of bubbles and/or particles in immersion liquid on the quality of the product.

According to an aspect, there is provided a device manufacturing method comprising:

providing an immersion liquid between a substrate and at least a portion of a projection system of a lithographic projection apparatus, wherein a non-radiation sensitive material is carried by said substrate, said non-radiation sensitive material being at least partially transparent to radiation and being of a different material than said immersion liquid, said non-radiation sensitive material being provided over at least a part of a radiation sensitive layer of said substrate; and projecting a patterned beam of radiation, through said immersion liquid, onto a target portion of said substrate using said projection system.

Bubbles on the surface of a substrate in contact with immersion liquid can be kept far away enough from the radiation sensitive material on the substrate so that their effect on the patterned beam is less than if the bubbles were closer to the radiation sensitive material. If the non-radiation sensitive material is made of sufficient thickness, it is possible that bubbles on the interface between the immersion liquid and the non-radiation sensitive material will only introduce stray light and not seriously affect the quality of the imaged product. The above also works on the same principle for particles which are present in the immersion liquid, as well as, or instead of, bubbles.

In an embodiment, the non-radiation sensitive material has a thickness and said radiation has a wavelength and said thickness is at least greater than said wavelength. In this way, when the radiation from a projection system passes through the non-radiation sensitive material its wavelength is reduced. This allows the imaging of smaller features on the substrate.

In an embodiment, the non-radiation sensitive material has a thickness of at least 5 µm. In embodiments, the thickness may be at least 10 µm or at least 20 µm. At these thicknesses, the effects on imaging of the bubbles and/or particles can be dramatically reduced. Also, it has been found that at these thicknesses it is possible to provide immersion liquid between a surface of the non-radiation sensitive material and a portion of the projection system which is effective to reduce the wavelength of the projection beam while aiming to reduce the effects of bubbles and/or particles on imaging quality.

In an embodiment, the non-radiation sensitive material has a first refractive index and the immersion liquid has a second refractive index, and said first refractive index is at least as large as said second refractive index such that the effect of the non-radiation sensitive material is not to increase the wavelength of the projection beam.

According to a further aspect, there is provided a substrate for use in a lithographic projection apparatus, the substrate being at least partly covered by a radiation sensitive layer, the radiation sensitive layer being at least partly covered with a non-radiation sensitive material which is at least partly transparent to said radiation and being of a different material than an immersion liquid through which a patterned beam of said radiation of the lithographic projection apparatus is projected onto a target portion of said substrate.

This substrate may be used in the method(s) described herein.

According to a further aspect, there is provided a device manufacturing method comprising:

providing an immersion liquid, between a substrate and at least a portion of a projection system of a lithographic projection apparatus, to a non-radiation sensitive material on said substrate, said non-radiation sensitive material, which is at least partially transparent to radiation, provided over at least a part of a radiation sensitive layer of said substrate and having a thickness effective to substantially reduce the effect of at least one of bubbles and particles in said immersion liquid on the quality of a patterned beam impinging on the radiation sensitive layer; and projecting a patterned beam of radiation, through said immersion liquid, onto a target portion of said substrate using said projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
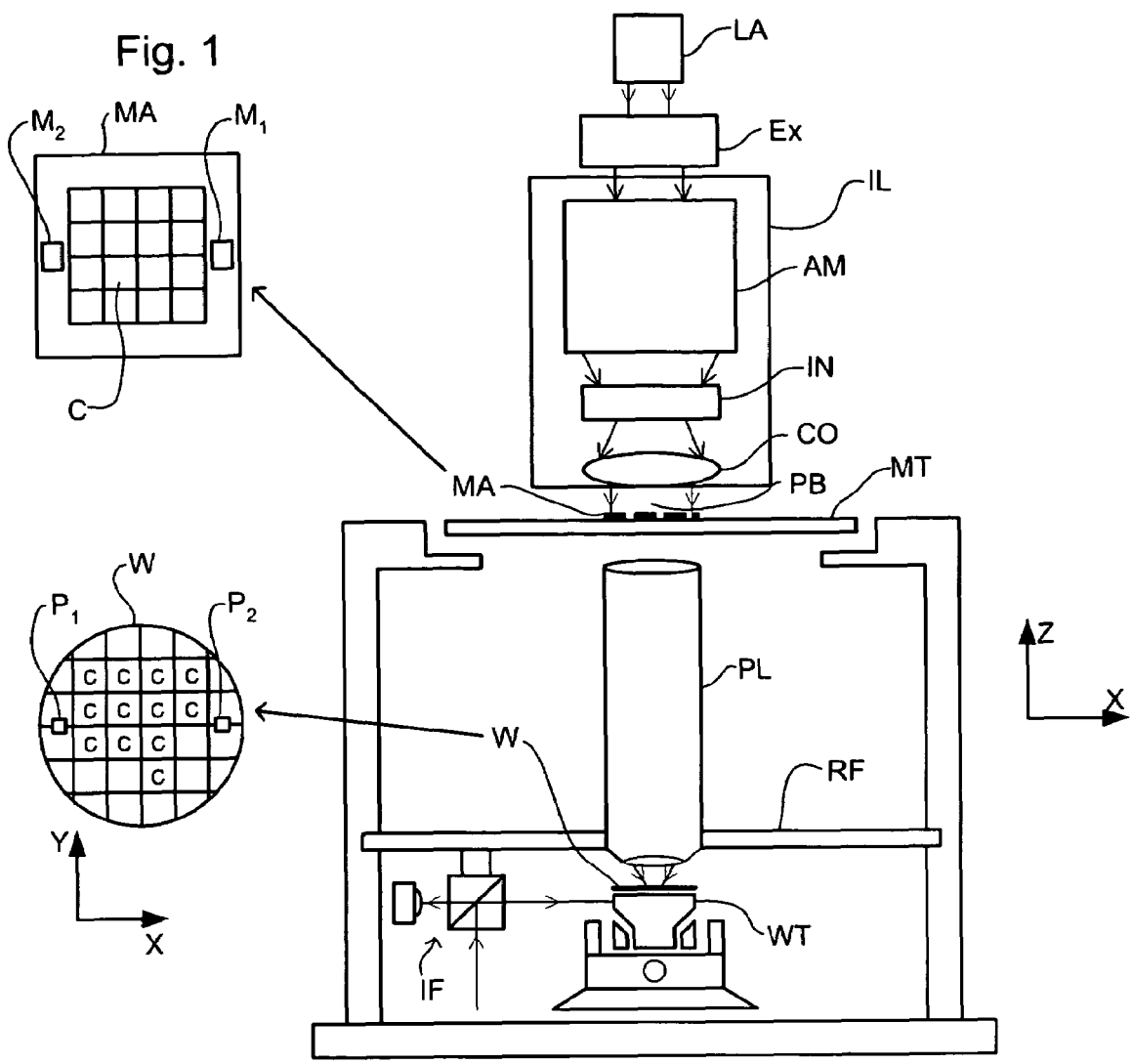
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g. UV radiation).
- a first support structure (e.g. a mask table) MT for supporting a patterning device (e.g. a mask) MA and connected to a first positioning device PM for accurately positioning the patterning device with respect to item PL;
- a substrate table (e.g. a wafer table) WT for holding a substrate (e.g. a resist-coated wafer) W and connected to a second positioning device PW for accurately positioning the substrate with respect to item PL; and
- a projection system (e.g. a refractive projection lens system) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
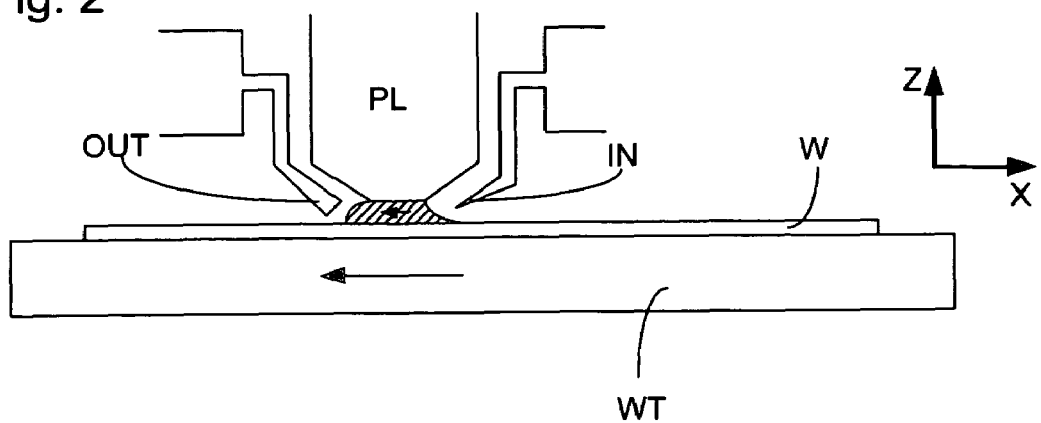
FIG. 2 illustrates, in cross-section, a liquid supply system for use with an embodiment of the invention.
Figure 3:
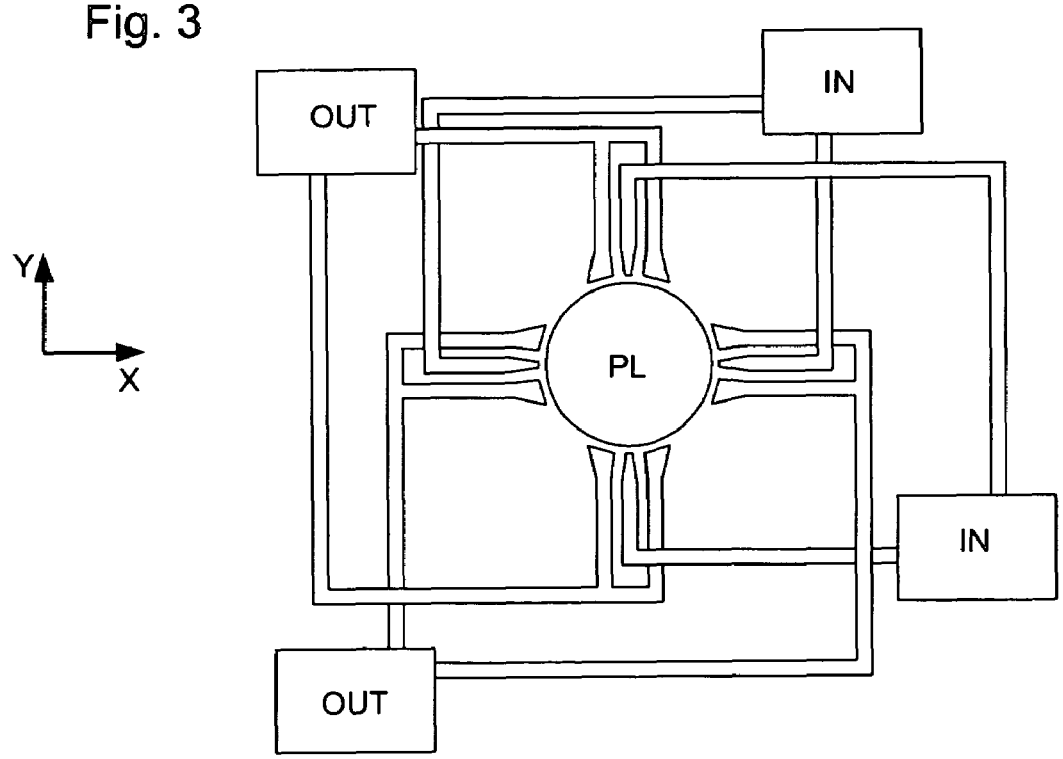
FIG. 3 illustrates the liquid supply system of FIG. 2 in plan.
Figure 4:
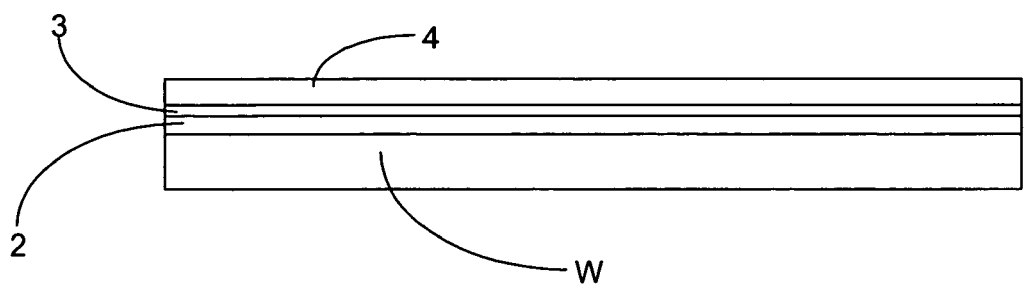
FIG. 4 illustrates a substrate according to an embodiment of the present invention.

FIG. 4 depicts a substrate W ready for processing in a lithographic apparatus of, for example, FIGS. 1 to 3. A layer of radiation sensitive material 2 (i.e. the so called "resist") is present on top of a surface of the substrate W. The radiation sensitive material 2 is approximately 200 nm thick. A layer 3 of protective material is present above the radiation sensitive material 2 to protect it from contaminants. This protective material is thin. In an embodiment, the thickness is less than one wavelength of the radiation of the projection beam. For example, the layer 3 of protective material may be approximately 80 nm thick.

A top coating 4 is provided above (e.g., applied to) the layer of protective material 3. The top coating or layer 4 is of a material not sensitive to radiation at the wavelength of the projection beam PB and is at least partially transparent to the radiation of the wavelength of the projection beam PB. In an embodiment, it is different to and immiscible with the immersion liquid. The top coating 4 is, in an embodiment, attached to said substrate W and may be solid. In an embodiment, the top coating 4 transmits at least 80% of the radiation of the projection beam. In embodiment, the top coating 4 may transmit at least 90% or at least 95% of the radiation of the projection beam. In an embodiment, the top coating 4 is also not reactive with the immersion liquid provided by the liquid supply system such as the one illustrated in FIGS. 2 and 3. It has been found that at a wavelength of 193 nm that water is a suitable liquid for use as an immersion liquid.

Figure 5A:
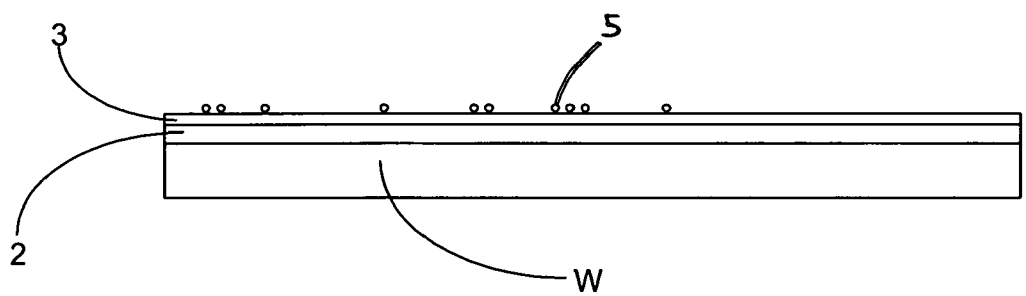
FIGS. 5a and 5b illustrate a conventional substrate and a substrate according to an embodiment of the invention respectively under a projection system during imaging.
Figure 5B:
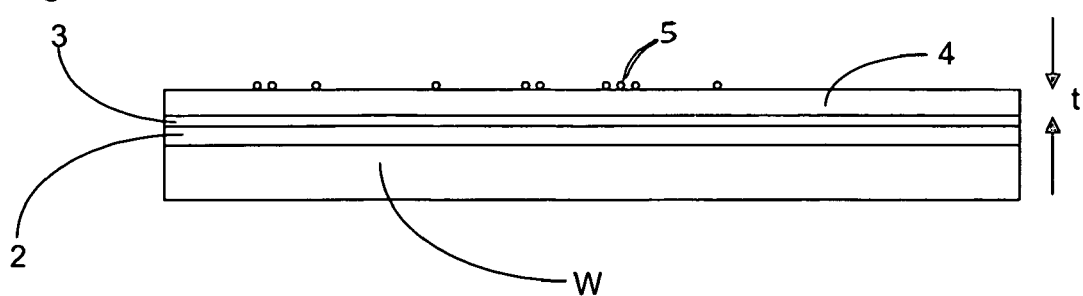

FIGS. 5a and 5b illustrate how an embodiment of the present invention functions. In FIG. 5a, the substrate W is a standard substrate covered, at least in part, with immersion liquid during imaging. FIG. 5b illustrates a substrate according to an embodiment of the invention during imaging. As can be seen in FIG. 5a, bubbles and/or particles 5 in the immersion liquid in a conventional substrate are only 80 nm away (i.e., the thickness of the protective layer 3) from the radiation sensitive layer 2. In this instance, any bubbles and/or particles on the surface of the substrate can seriously affect the imaging quality, for example, by being within the depth of focus. In contrast, as can be seen from FIG. 5b, the top coating 4 keeps any bubbles and/or particles in the immersion liquid at least a distance t from the radiation sensitive layer 2. Thus, the effect of the bubbles and/or particles on the imaging quality can be considerably reduced (for example, by having the bubbles and/or particles out of focus) without making the lithographic projection apparatus any more complex.

In an embodiment, it is desired that the top coating 4 has a refractive index substantially the same as that of the immersion liquid, perhaps within 0.2 or 0.1 of that of the immersion liquid. In this way, optical effects such as those resulting from variations in thickness of the coating 4 can be ignored. Thus, in an embodiment, the top coating 4 has a refractive index greater than that of air, in an embodiment as much as that of the immersion liquid if not more. In an embodiment, the non-radiation sensitive material has a refractive index in the range of 1 to 1.7.

In an embodiment, the top coating 4 is much thicker than the wavelength of the projection beam. A thickness to bubble and/or particle diameter ratio should be as close as possible to or larger than 10 to 1. The maximum expected bubble and/or particle size is 1 µm so for best performance the thickness of the top coating 4 should be at least 10 µm. In an embodiment, the thickness may be at least 20 µm or at least 30 µm and up to 100 µm above which the coating may become harder to provide and cost prohibitive.

In an embodiment, the non-radiation sensitive material is substantially insoluble and unreactive in the immersion liquid. If this is not the case, embodiments of the invention will still work but it may be necessary to take dissolution of the top coating 4 into account during imaging of the substrate. In an embodiment, the top coating 4 can be removed with solvents which are typically used with resist processing.

The top coating 4 may be a layer of water with an anti-evaporation coating or similar to the (conventional) layer 3 of protective material which is a water based gel (conventionally known as a top coat). Polymers or plastics may be suitable.

It will be apparent that the function of the layer 3 of protective material and the top coating 4 can be performed by one and the same layer applied at the same time with the thicknesses and properties as described above (i.e. an embodiment of the invention can be regarded as a 'thick' top coat).

While specific embodiments of the invention have been described above, it will be appreciated that the invention may be practiced otherwise than as described. The description is not intended to limit the invention.

The invention claimed is:

1. A device manufacturing method comprising:
providing a liquid between a substrate and at least a portion of a projection system of a lithographic projection apparatus, wherein a non-radiation sensitive material is carried by said substrate, said non-radiation sensitive material being at least partially transparent to radiation, being of a different material than said liquid, being provided over at least a part of a radiation sensitive layer of said substrate, and said non-radiation sensitive material having a thickness of at least 5 µm; and
projecting a patterned beam of radiation, through said liquid, onto a target portion of said substrate using said projection system.

2. A method according to claim 1, wherein said radiation has a wavelength and said thickness is greater than said wavelength.

3. A method according to claim 1, wherein said non-radiation sensitive material has a thickness one of at least 10 µm and at least 20 µm.

4. A method according to claim 1, wherein said non-radiation sensitive material has a first refractive index and said liquid has a second refractive index, and said first refractive index is within 0.2 of said second refractive index.

5. A method according to claim 4, wherein said first refractive index is one of within 0.1 of and substantially the same as said second refractive index.

6. A method according to claim 1, wherein said non-radiation sensitive material has a refractive index in the range of 1.0 to 1.7.

7. A method according to claim 1, wherein said non-radiation sensitive material is substantially insoluble in and unreactive with said liquid.

8. A method according to claim 1, wherein a further protective material is present between said radiation sensitive layer and said non-radiation sensitive layer.

9. A method according to claim 1, wherein the non-radiation sensitive layer is of a thickness effective to substantially reduce the effect of bubbles, particles, or both bubles and particles, in said liquid on the quality of the patterned beam impinging on the radiation sensitive layer.

10. A method according to claim 1, further comprising at least partly coating said radiation sensitive layer of said substrate with said non-radiation sensitive material.

11. A device manufacturing method comprising:
providing a liquid, between a substrate and at least a portion of a projection system of a lithographic projection apparatus, to a non-radiation sensitive material on said substrate, said non-radiation sensitive material, which is at least partially transparent to radiation, provided over at least a part of a radiation sensitive layer of said substrate and having a thickness effective to substantially reduce the effect of bubbles, particles, or both bubbles and particles, in said liquid on the quality of a patterned beam impinging on the radiation sensitive layer; and
projecting a patterned beam of radiation, through said liquid, onto a target portion of said substrate using said projection system.

12. A method according to claim 11, wherein said thickness is greater than a wavelength of said radiation.

13. A method according to claim 11, wherein said thickness is at least 5 µm.

14. A method according to claim 13, wherein said thickness is one of at least 10 µm and at least 20 µm.

15. A method according to claim 11, wherein said non-radiation sensitive material has a first refractive index and said liquid has a second refractive index, and said first refractive index is within 0.2 of said second refractive index.

16. A method according to claim 15, wherein said first refractive index is one of within 0.1 of and substantially the same as said second refractive index.

17. A method according to claim 11, wherein said non-radiation sensitive material has a refractive index in the range of 1.0 to 1.7.

18. A method according to claim 11, wherein said non-radiation sensitive material is substantially insoluble in and unreactive with said liquid.

19. A method according to claim 11, wherein a further protective material is present between said radiation sensitive layer and said non-radiation sensitive layer.

20. A method according to claim 11, further comprising at least partly coating said radiation sensitive layer of said substrate with said non-radiation sensitive material.

* * * * *